United States Patent [19]
Schubert

[11] Patent Number: 5,932,899
[45] Date of Patent: Aug. 3, 1999

[54] SEMICONDUCTOR HAVING ENHANCED ACCEPTOR ACTIVATION

[75] Inventor: E. Fred Schubert, Canton, Mass.

[73] Assignee: Trustees of Boston University, Boston, Mass.

[21] Appl. No.: 08/916,292

[22] Filed: Aug. 22, 1997

Related U.S. Application Data

[60] Provisional application No. 60/024,547, Aug. 23, 1996.

[51] Int. Cl.$^6$ .................... H01L 29/205; H01L 31/0328; H01L 33/00
[52] U.S. Cl. ............................. 257/191; 257/14; 257/15; 257/17; 257/22; 257/97
[58] Field of Search .................................. 257/17, 15, 14, 257/22, 97, 13, 191

[56] References Cited

U.S. PATENT DOCUMENTS 5,298,108  3/1994  Miller ......................................... 257/13
5,679,965  10/1997  Schetzine ................................. 257/104

Primary Examiner—Jerome Jackson, Jr.
Attorney, Agent, or Firm—Samuels, Gauthier & Stevens, LLP

[57] ABSTRACT

A semiconductor having enhanced acceptor activation is disclosed. The semiconductor comprises a ternary compound having a non-abruptly varying composition that is uniformly doped. The modulation of the chemical composition leads to a variation of the valence band energy. The modulation of the valence band results in a strong enhancement of the acceptor activation. A method for making a semiconductor having enhanced acceptor activation comprises two steps. They are (1) forming a ternary compound semiconductor having a non-abruptly varying composition, and (2) uniformly doping said semiconductor with a dopant. These two steps may be conducted simultaneously.

10 Claims, 4 Drawing Sheets

SEMICONDUCTOR HAVING ENHANCED ACCEPTOR ACTIVATION

This application claims the benefit of U.S. Provisional Application No. 60/024,547, filed Aug. 23, 1996.

FIELD OF THE INVENTION

The present invention relates to semiconductor devices. More specifically, this invention relates to a uniformly doped ternary compound semiconductor structure with a spatially modulated chemical composition.

BACKGROUND OF THE INVENTION

Achieving high p-type conductivity in many wide-bandgap semiconductors is difficult due to the large acceptor binding energies. In the case of III–V nitrides, the acceptor effective Rydberg energies are 200–400 meV for commonly used acceptors such as Mg and Zn. The free carrier concentration in the freeze-out regime ($E_a \gg kT$) in a semiconductor with an acceptor concentration $N_A$ and an acceptor binding energy of $E_a$, is given by $$p = \sqrt{\frac{1}{g} N_A N_v} \exp\left(-\frac{E_a}{2kT}\right) \quad (1)$$

where g is the acceptor degeneracy, $N_v$, is the effective density of states at the valence band edge, and kT is the thermal energy. For activation energies of 200 meV, the electrical activation calculated from Eq. (1) is 6%.

A possible solution to this problem is to heat the semiconductor to higher temperatures thereby increasing the thermal energy, kT. As a result, more acceptors would be ionized. However, this solution is impractical since it is desirable to operate semiconductor devices at room temperature.

Another possible solution is to dope a superlattice structure with acceptors. Acceptor doping in a superlattice structure in wide-bandgap II–VI materials, such as ZnSe, is known in the art For instance, doping of acceptors in a superlattice structure to improve the activation ratio was proposed in an article by Suemune. Suemune, "Doping in a superlattice structure: Improved hole activation in wide-gap II–VI materials," *J. Appl. Phys.*, Vol. 67, No. 5, Mar. 1, 1990. However, while the structures of Suemune exhibit high conductivity parallel to the superlattice planes, their conductivity is poor along a direction normal to the superlattice plains.

SUMMARY OF THE INVENTION

To overcome these and other drawbacks, a semiconductor having enhanced acceptor activation is disclosed. It comprises a ternary compound having a composition that is uniformly doped. The modulation of the chemical composition leads to a variation of the valence band energy. This variation of the valence band energy results in a strong enhancement of the acceptor activation.

In another embodiment, a method for making a semiconductor having enhanced acceptor activation comprises two steps. First, a ternary compound semiconductor having a non-abruptly varying composition is formed. Then, the ternary compound semiconductor is doped with a dopant. These two steps may be conducted simultaneously.

A technical advantage of the present invention is that a semiconductor having enhanced acceptor activation is disclosed. Another technical advantage is that the present invention enhances the activation by more than one order of magnitude. Another technical advantage is that the free carrier concentration increases for graded structures.

DETAILED DESCRIPTION OF THE INVENTION

The preferred embodiment of the present invention and its advantages are best understood by referring to FIGS. 1 through 6 of the drawings. According to one embodiment of the present invention, a semiconductor having enhanced acceptor activation is disclosed. The semiconductor comprises a ternary semiconductor structure (i.e., a three-material semiconductor) whose composition varies spatially on a microscopic scale and that is doped with either an acceptor or donor impurity (i.e, p-type or n-type).

Figure 1A:
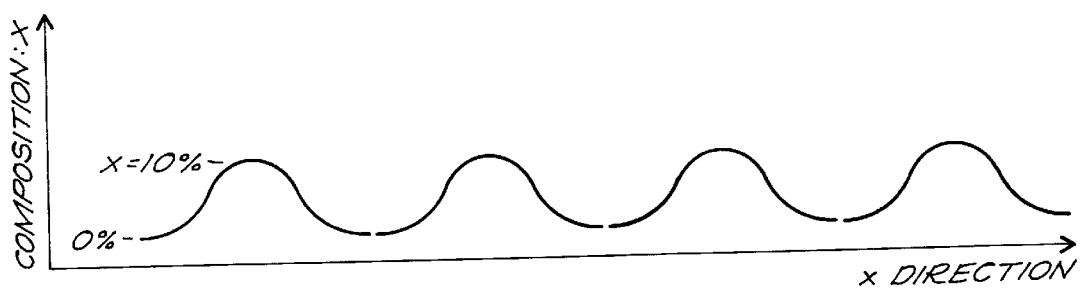
FIGS. 1a–c shows the relationship of a composition to spatial dimensions according to two embodiments of the present invention.
Figure 1B:
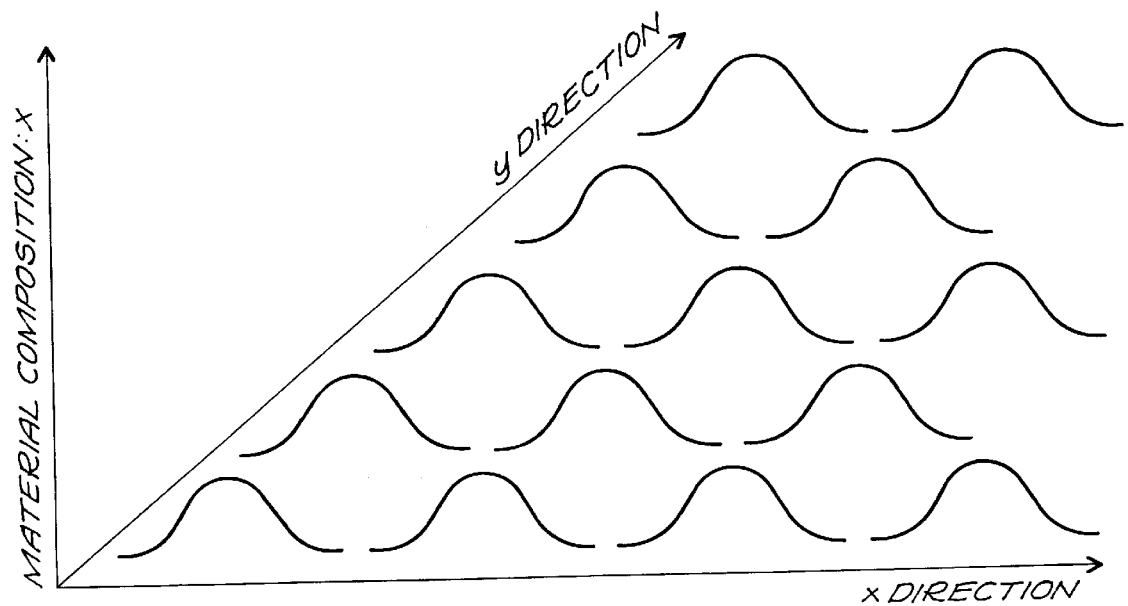
Figure 1C:
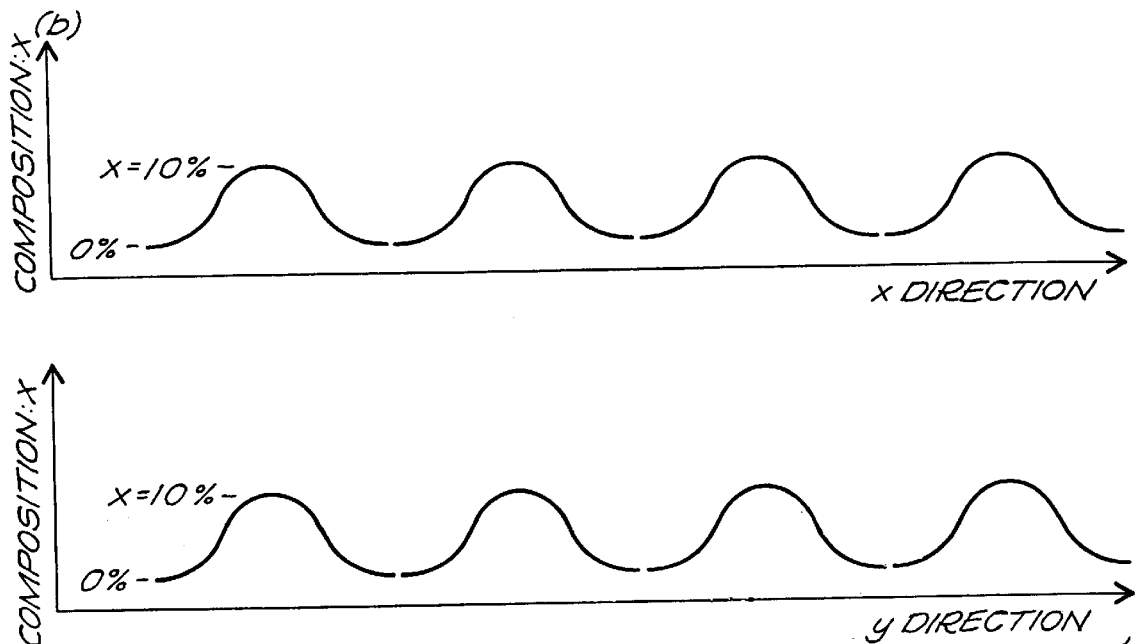

FIGS. 1(a)–(c) are graphs illustrating spatially varying compositions of semiconductors according to two embodiments of the present invention. The graphs illustrate the variations in the composition of a ternary semiconductor having a generic chemical formula $A_x B_{1-x} C$, where A and B may be selected from Group IIIA and C may be selected from Group VA. The subscript x is the chemical composition of the material. For example, if x=0%, the resulting material is BC, and if x=100%, then the resulting material is AC. Examples of such semiconductor alloys are $Al_2 Ga_{1-x} N$ and $Ga_x IN_{1-x} N$. The bandgap varies with the composition x of the semiconductor; thus, the bandgap which separates the valence band and the conduction band varies in space.

In FIG. 1(a), a graph illustrating a varying concentration of element A in a material is given. The concentration of A varies in only one direction, the x-direction. More specifically, as shown in the graph, the concentration of A varies between 0–10% as the position along the x-axis varies.

A structure having the concentration illustrated in FIG. 1(a) may be fabricated by any of a number of known techniques. For example, epitaxy, i.e., the growth of crystine semiconductor on a substrate, may be used. Organo-metallic vapor phase epitaxy (OMVPE) is one preferred method for fabricating GaN and other III–V semiconductor materials. In this embodiment, the composition of the structure is varied by, for example, periodically changing the precursor compounds flowing into the reactor. Other fabrication methods may also be used.

The composition of a structure may also vary along two spatial dimensions. FIG. 1(b) illustrates a ternary semiconductor having a structure in which the concentration of the A component varies along two spatial dimensions. The concentration of A varies in both the x-direction and in the y-direction. More specifically, as shown on the graphs in FIG. 1(c), the concentration of A varies between 0–10% as the position along the x- or y-axis varies.

The structure of FIG. 1(b) may be produced according to any known method. One method of fabrication is to start with the growth of a structure that has an composition that varies in one-dimension, e.g., the structure shown in FIG. 1(a). After the one-dimensional growth, trenches may be etched into the epitaxial film. Subsequent to the etching, the trenches are regrown (or "filled") with a superlattice, such as $Al_xGa_{1-x}N/GaN$ or $Ga_xIn_{1-x}N/GaN$, whose period is phase-shifted with respect to the first deposition. By doing so, a two-dimensional variation of the composition can be achieved. The composition may vary periodically, with a typical period between 40 and 400 Å, or it may vary non-periodically. It should be pointed out that the etching and regrowth are accomplished in such a way to help ensure the composition does not vary abruptly. That is, the composition is smoothly graded.

A structure having a composition that varies in three dimensions may also be used. Such a structure can be fabricated by methods known in the art. For example, Leon et al. disclose a method of self-assembly fabrication. See Leon et al., "Spatially resolved visible luminescence of self assembled semiconductor quantum dots," *Science*, 267, 1966 (1995). Leon et al. uses self-organizing mechanisms occurring during crystal growth to grow superlattices in which the composition varies along three spatial dimensions.

In order to form a semiconductor with enhanced acceptor activation according to the present invention, once the initial structure is established, the structure is doped. Any known technique for doping may be used. In a preferred embodiment, doping during crystal growth is used to achieve the desired dopant concentration within the semiconductor described above. Other doping techniques, such as implantation and diffusion of impurities, may also be used.

As an example of the technique of doping a semiconductor having a non-abruptly varying composition according to the present invention, thin layers of AlGaN are doped with acceptors. The thin AlGaN layers are then surrounded by GaN. Normally, GaN has acceptor levels 200–300 meV above the valance band edge. However, when AlGaN is combined with GaN, forming a heterostructure, the acceptor ionization energy is reduced. The acceptor levels in semiconductors are usually attached to the valence band. Therefore, since there is a lower activation energy for acceptors, there will be a higher ionization probability in the heterostructure, and thus an enhanced acceptor activation.

The compositional modulation and doping results in a n- or p-type doped semiconductor alloy whose chemical composition varies. Since the two semiconductors forming the alloy (e.g., GaAs and AlN form the alloy $Al_xGa_{1-x}N$) have a different bandgap energy, the bandgap energy of the alloy varies according to the composition. The variation of the chemical composition and the resulting variation of the bandgap energy results in a higher electrical activation of the n- or p-type doping impurities with which the semiconductor is doped.

Figure 2A:
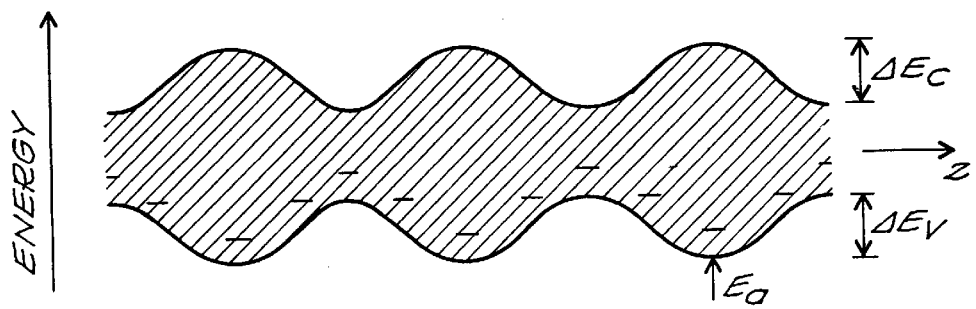
FIG. 2 represents the schematic band diagram of a "straddled lineup" alloy semiconductor with a modulated chemical composition according to one embodiment of the present invention.
Figure 2B:
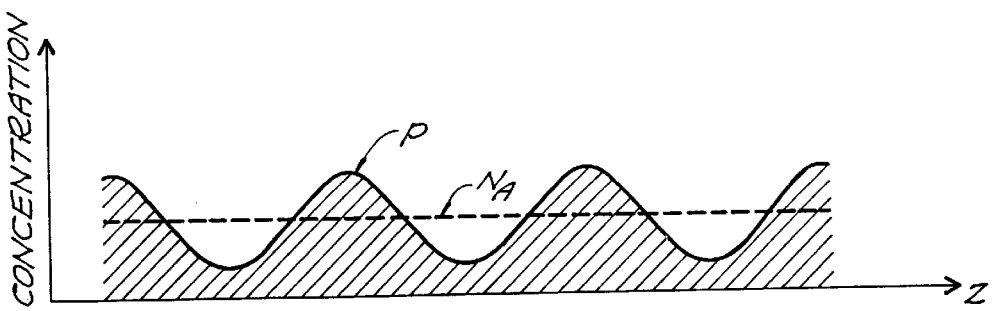

An example of a band diagram of a uniformly doped, composition-modulated semiconductor structure is shown in FIG. 2(a). It is assumed that the acceptor effective Bohr radius is much smaller than the period of the structure, so that the acceptor levels in the barriers are not influenced by adjacent wells and vice-versa. For an effective mass of $m_h^*=0.8\ m_o$ (where $m_o$ is the electron mass in free space), the effective Bohr radius calculated for hydrogenic impurities is 6 Å, i.e., much smaller than the period of the superlattice. FIG. 2(b) schematically shows the free carrier concentration in the valence band. The hole concentration is modulated and follows the potential modulation of the valence band.

Figure 3:
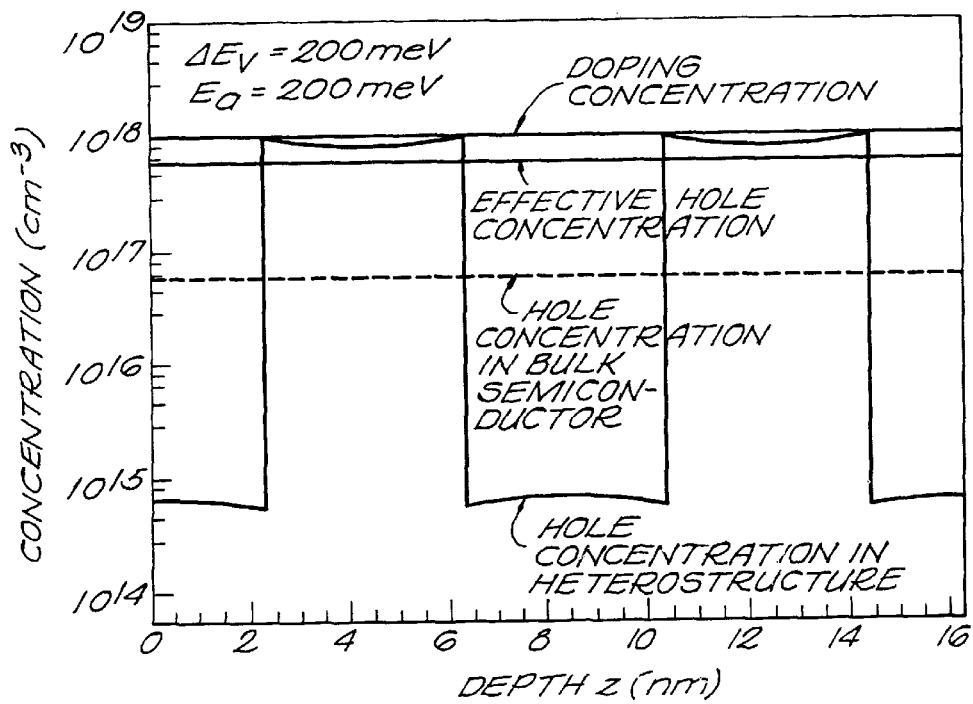
FIG. 3 represents the calculated hole concentration in a semiconductor structure with a modulated valence band energy according to one embodiment of the present invention.

The free carrier concentration along with the doping concentration for a semiconductor having a non-abruptly varying composition according to the present invention are shown in FIG. 3. The free carrier concentration reaches $10^{18}$ cm$^{-3}$ in the wells demonstrating very high activation of the deep acceptors. The effective carrier concentration, defined as the arithmetic average over the period of the structure, is given by $5\times 10^{17}$ cm$^{-3}$. Thus, the effective activation of the acceptor impurities is 50%, which is nearly a factor of ten higher than the concentration of a homogenous (unmodulated) semiconductor with the same materials parameters, where a free carrier concentration inferred from Eq. (1) is $5.5\times 10^{16}$ cm$^{-3}$, corresponding to an activation of only 6%. The higher doping activation in the modulated structure will result in higher conductivity, in particular, for transport in the planes of the modulated layers. Due to the compositional grading, the conductivity normal to the superlattice plane will also be strongly enhanced.

According to the present invention, very high electrical activation of deep acceptors can be achieved, if the acceptor energy levels in the barriers are energetically close to the valence band states in the wells. This condition may be written as $$\Delta E_v - E_a \geq E_{0h} + (E_F - E_{0h}) + E_{dipole} \tag{2}$$

where $E_{0h}$ is the energy of the lowest quantized state relative to the top of the valence band, $(E_f - F_{0h})$ is the band filling of the valence band states, and $E_{dipole}$ is the energy due to the polarization of the material (band bending). The latter energy is given by Poisson's equation:

$$E_{dipole} = -\frac{e^2}{\varepsilon}\int_0^{(z_p/2)}\int_0^{z} p(z') - N_{\bar{A}}(z) dz' dz. \tag{3}$$

where $z_p$ is the period of the composition modulation in the structure. This period is chosen small enough to make band bending effects negligible and large enough (well thickness>30 Å for $m_h^*=0.8\ m_c$) to make confinement effects negligible.

The acceptor activation efficiency is defined as $$\eta = \frac{P_{\mathit{eff}}}{N_A} = \frac{1}{N_A}\frac{1}{z_p}\int_0^{z_p} p(z)dz. \tag{4}$$

The efficiency approaches unity for large barriers and narrow wells if the condition of Eq. (2) is fulfilled. Efficiencies of at least 85% may be achieved for asymmetric structures with a barrier-to-well width ratio of 8:1. This activation efficiency corresponds to an increase by more than a factor of ten when compared to an unmodulated structure. In an embodiment where the structures uniformly doped, diffusion of impurities is irrelevant assuming that the diffusion coefficient in the barriers and wells is the same.

Use of graded structures according to embodiments of the present invention minimizes the ohmic resistance for transport across the barriers. The curvature of the graded region may be chosen in such a way so that the electrostatic depletion potential of ionized acceptors in the barriers is similar to the valence band modulation caused by the compositional modulation. This results in low resistances for transport across the barriers.

In one embodiment, the grading may be parabolic. In another embodiment, the grading may be sinusoidal. Other continuous, non-abrupt gradings may also be used.

Figure 4:
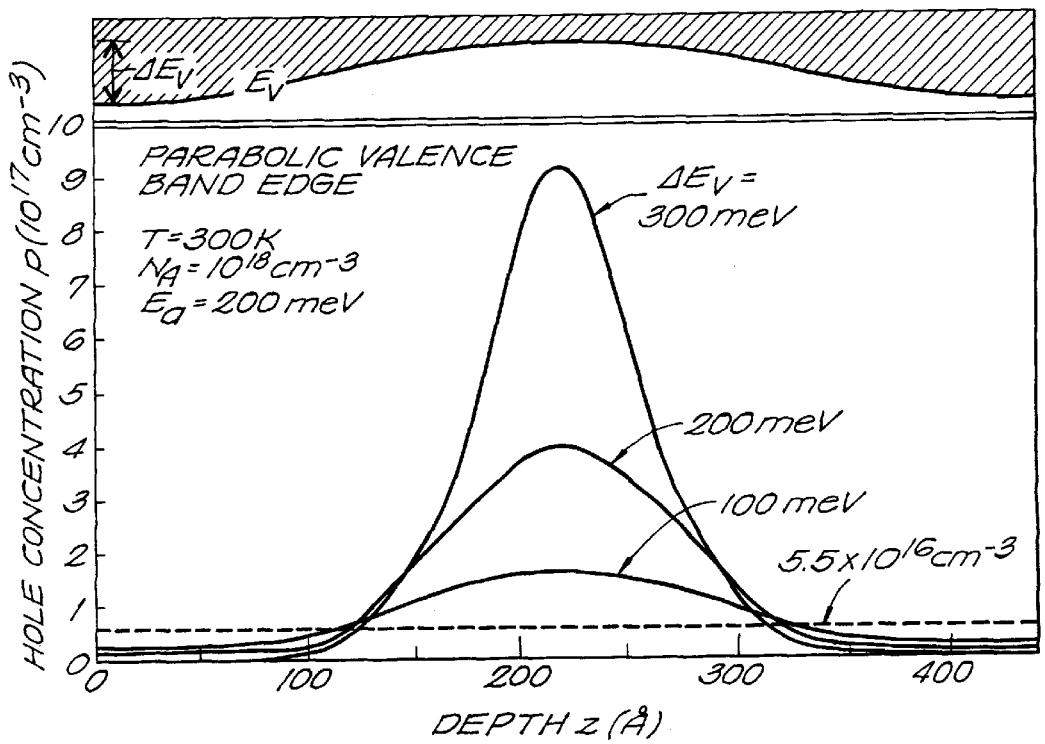
FIG. 4 shows the hole concentration vs. depth for different magnitudes of valence band modulation in a parabolically graded structure according to embodiments of the present invention.

An example of the calculated free carrier concentration of free parabolically graded structures are shown in FIG. 4. The magnitude of the valence band modulation is $\Delta E_v = 100, 200$, and 300 meV. The structure has a period of $z_p = 440$ Å. FIG. 4 shows free carrier peak concentrations as high as $\approx 10^{18}$ cm$^{-3}$ for the largest band modulation.

Figure 5:
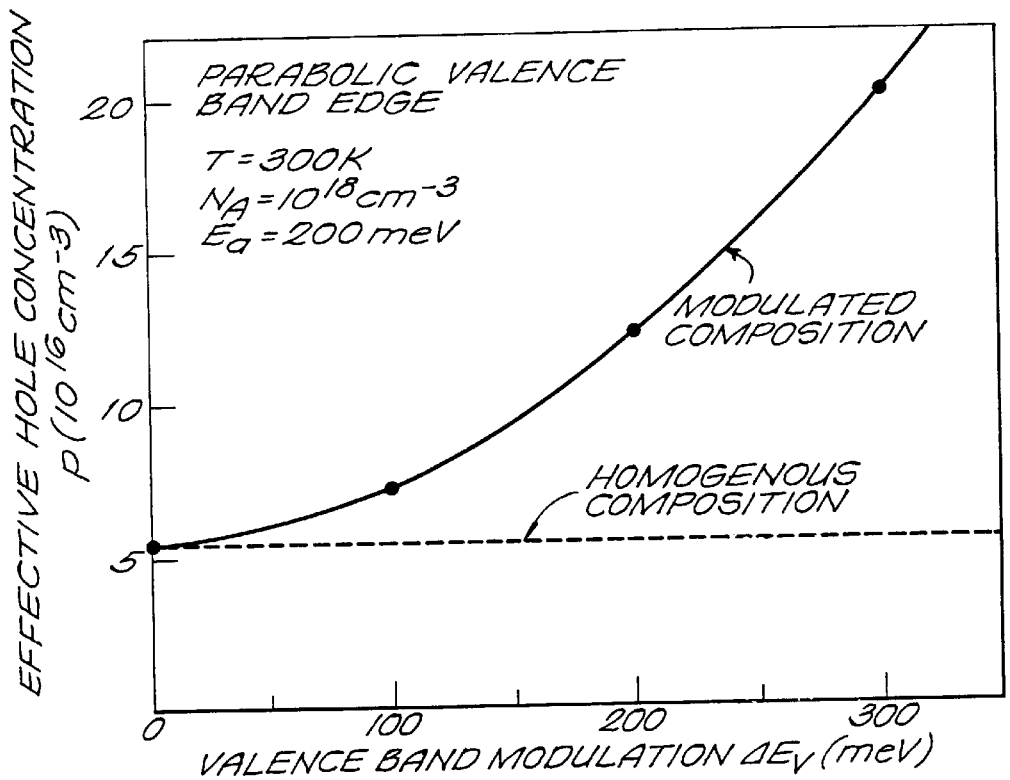
FIG. 5 represents the effective hole concentration as a function of valence band modulation for in a parabolically graded structure according to embodiments of the present invention.

An example of the effective free carrier concentration of the parabolically graded structure is shown in FIG. 5 for three different band modulations. The carrier concentration of the unmodulated structure is shown for comparison. For the highest band modulation ($\Delta E_v = 300$ meV), a carrier concentration 3.6 times higher than normal is obtained.

Figure 6:
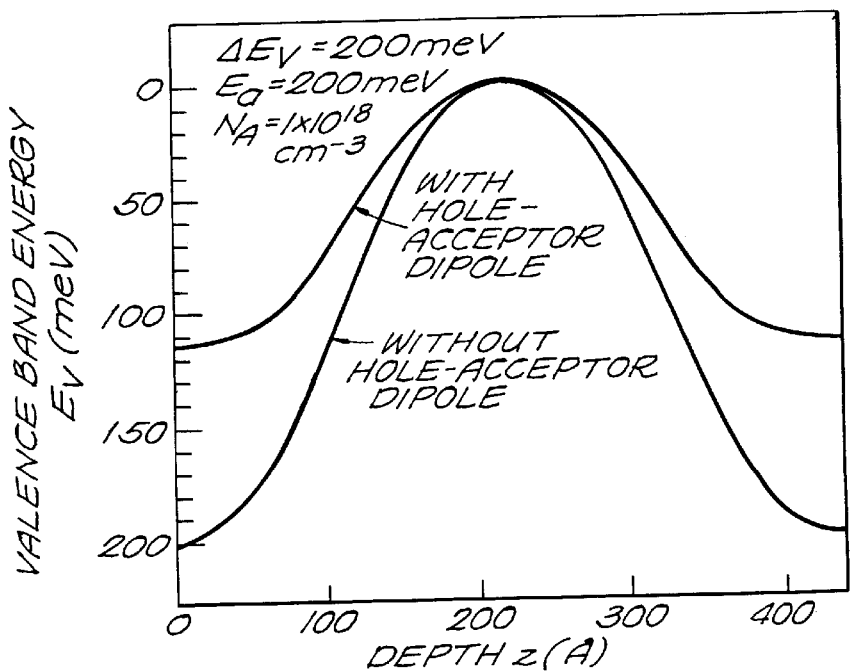
FIG. 6 represents the valence band modulation of a parabolically graded structure with and without taking into account the band modulation caused by hole and acceptor charges.

An example of the band modulation of the parabolically graded structure with $\Delta E_v = 200$ meV is shown in FIG. 6. Both the band modulation and the modulation with and without the reduction by the electrostatic dipole potential are shown. The modulation of the concentration of ionized acceptors and holes, accumulated in the valence band maxima, lead to a reduction of the valence band modulation. The residual modulation is approximately 115 meV. If the dipole energy becomes comparable to the magnitude of the band modulation, a decrease in the acceptor activation results.

While the invention has been particularly shown and described by the foregoing detailed description, it will be understood by those skilled in the art that various other changes in form and detail may be made without departing from the spit and scope of the invention.

I claim:

1. A semiconductor having an enhanced acceptor activation comprising:

a ternary compound semiconductor having a non-abruptly periodically varying composition;

wherein said ternary compound semiconductor is doped.

2. The semiconductor of claim 1, wherein said composition of said ternary compound semiconductor varies in one dimension.

3. The semiconductor of claim 1, wherein said composition of said ternary compound semiconductor varies in two dimensions.

4. The semiconductor of claim 1, wherein said composition of said ternary compound semiconductor varies in three dimensions.

5. The semiconductor of claim 1, wherein the period of said periodically varying composition is between 40 and 400 Å.

6. The semiconductor of claim 1, wherein said ternary compound semiconductor comprises uniform p-type doping.

7. The semiconductor of claim 1, wherein said composition of said ternary compound semiconductor varies parabolically.

8. The semiconductor of claim 1, wherein said composition of said ternary compound semiconductor varies sinusoidally.

9. The semiconductor of claim 1 having the composition $Al_xIn_{1-x}N$.

10. The semiconductor of claim 1 having the composition $Al_xGa_{1-x}N$.

* * * * *

UNITED STATES PATENT AND TRADEMARK OFFICE
CERTIFICATE OF CORRECTION

PATENT NO. : 5,932,899
DATED : August 3, 1999
INVENTOR(S) : Fred E. Schubert

It is certified that error appears in the above-identified patent and that said Letters Patent is hereby corrected as shown below:

Please amend the first paragraph of the specification to read:
"This invention was made with government support under Contract No. N00014-98-1-0194 awarded by the Office of Naval Research and Contract No. ECS9714047 awarded by the National Science Foundation. The government has certain rights in the invention."

Signed and Sealed this

Sixth Day of November, 2001

*Attest:*

*Attesting Officer*

NICHOLAS P. GODICI
*Acting Director of the United States Patent and Trademark Office*